(12) United States Patent
Aramaki et al.

(10) Patent No.: US 10,106,672 B2
(45) Date of Patent: Oct. 23, 2018

(54) HEAT CONDUCTIVE SHEET

(71) Applicant: DEXERIALS CORPORATION, Tokyo (JP)

(72) Inventors: Keisuke Aramaki, Utsunomiya (JP); Takuhiro Ishii, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 14/401,954

(22) PCT Filed: Jul. 5, 2013

(86) PCT No.: PCT/JP2013/068475
§ 371 (c)(1),
(2) Date: Nov. 18, 2014

(87) PCT Pub. No.: WO2014/010520
PCT Pub. Date: Jan. 16, 2014

(65) Prior Publication Data
US 2015/0166771 A1    Jun. 18, 2015

(30) Foreign Application Priority Data
Jul. 7, 2012  (JP) .................................. 2012-153147

(51) Int. Cl.
| | |
|---|---|
| *C08K 7/06* | (2006.01) |
| *C08L 83/04* | (2006.01) |
| *C08K 3/22* | (2006.01) |
| *C08K 3/28* | (2006.01) |
| *C08K 7/18* | (2006.01) |
| *H01L 23/373* | (2006.01) |
| *C08J 5/04* | (2006.01) |

(52) U.S. Cl.
CPC ................. *C08K 7/06* (2013.01); *C08J 5/042* (2013.01); *C08K 3/22* (2013.01); *C08K 3/28* (2013.01); *C08K 7/18* (2013.01); *C08L 83/04* (2013.01); *H01L 23/3733* (2013.01); *H01L 23/3737* (2013.01); *C08J 2383/02* (2013.01); *C08K 2003/2227* (2013.01); *C08K 2003/282* (2013.01); *C08K 2201/001* (2013.01); *C08K 2201/003* (2013.01); *H01L 2924/0002* (2013.01)

(58) Field of Classification Search
CPC ... C08K 7/06; C08K 3/22; C08K 3/28; C08K 7/18; C08J 5/042; C08L 83/04; H01L 23/3733; H01L 23/3737

USPC ................................................... 524/495, 496
See application file for complete search history.

(56) References Cited

U.S. PATENT DOCUMENTS

| | | | |
|---|---|---|---|
| 8,808,607 B2 * | 8/2014 | Usui ......................... | C08J 5/18 264/104 |
| 2003/0153667 A1 | 8/2003 | Jayaraman et al. | |
| 2011/0030940 A1 * | 2/2011 | Takeda .................. | H01L 23/373 165/185 |
| 2013/0136895 A1 | 5/2013 | Usui et al. | |

FOREIGN PATENT DOCUMENTS

| | | | | |
|---|---|---|---|---|
| CN | 1057282 A | 12/1991 | | |
| EP | 0 257 466 A2 | 3/1988 | | |
| EP | 0937744 A1 * | 8/1999 | ............... | C08K 7/06 |
| EP | 1 469 513 A2 | 10/2004 | | |
| EP | 1 820 870 A1 | 8/2007 | | |
| EP | 1 956 110 A1 | 8/2008 | | |
| EP | 2 289 861 A1 | 3/2011 | | |
| EP | 2 583 993 A1 | 4/2013 | | |
| JP | H09283955 A | 10/1997 | | |
| JP | 2001-160607 A | 6/2001 | | |
| JP | A-2002-46137 | 2/2002 | | |
| JP | A-2004-23088 | 1/2004 | | |
| JP | A-2005-347616 | 12/2005 | | |
| JP | 2006-335958 A | 12/2006 | | |
| JP | 2006335958 A * | 12/2006 | | |
| JP | 4307798 B2 | 8/2009 | | |
| JP | A-2011-35046 | 2/2011 | | |
| JP | B2-4814550 | 11/2011 | | |
| JP | A-2012-23335 | 2/2012 | | |
| WO | 2011/158942 A1 | 12/2011 | | |
| WO | WO 2011158942 A1 * | 12/2011 | ................ | C08J 5/18 |

* cited by examiner

*Primary Examiner* — Kelechi G Egwim
(74) *Attorney, Agent, or Firm* — Oliff PLC

(57) ABSTRACT

A heat conductive sheet is provided in which the frequency of contact between fibrous fillers is high. In the heat conductive sheet, the exposed ends of fibrous fillers do not remain exposed and are embedded into the sheet, and it is unnecessary to apply a load that may interfere with the normal operation of a heat generating body and a heat dissipator to the heat generating body and the heat dissipator when the heat conductive sheet is disposed therebetween. The heat conductive sheet contains fibrous fillers and a binder resin, and the ratio of the fibrous fillers that are not oriented in the direction of the thickness of the heat conductive sheet in all the fibrous fillers is 45 to 95%.

7 Claims, No Drawings

HEAT CONDUCTIVE SHEET

TECHNICAL FIELD

The present invention relates to a heat conductive sheet.

BACKGROUND ART

To prevent failure of a heat generating body such as an IC chip which generates heat during operation, the heat generating body is brought into intimate contact with a heat dissipator such as a heat dissipation fin through a heat conductive sheet. An idea recently proposed to improve the heat conductivity of such a heat conductive sheet is to produce the heat conductive sheet by orienting fibrous fillers in a direction of the thickness of a laminar thermosetting resin composition, in which the fibrous fillers are dispersed in a thermosetting resin, using a magnetic field generator and then curing the thermosetting resin (Patent Literature 1). In this heat conductive sheet, ends of 50 to 100% of the fibrous fillers of all the fibrous fillers are exposed at the surface of the sheet. When the heat conductive sheet is applied between a heat generating body and a heat dissipator, the exposed ends of the fibrous fillers are embedded into the heat conductive sheet.

CITATION LIST

Patent Literature

Patent Literature 1: Japanese Patent No. 4814550

SUMMARY OF INVENTION

Technical Problem

One problem with the heat conductive sheet in Patent Literature 1 is as follows. At least about half of all the fibrous fillers are oriented in the direction of the thickness of the sheet. Therefore, even when the fibrous fillers are embedded, the frequency of contact between the fibrous fillers is small, and the thermal resistance is not reduced sufficiently. Another problem is that, depending on the conditions under which the heat conductive sheet is applied between the heat generating body and the heat dissipator, the exposed ends of the fibrous fillers are not embedded into the sheet. Another problem in this case is that, to fully embed the exposed ends of the fibrous fillers into the sheet, a load that may interfere with the normal operation of the heat generating body and the heat dissipator is necessarily applied thereto when the heat conductive sheet is disposed between the heat generating body and the heat dissipator.

It is an object of the present invention to solve the above-described problems in the conventional technology. More specifically, it is an object to provide a heat conductive sheet in which the frequency of contact between the fibrous fillers is high, in which the exposed ends of the fibrous fillers do not remain exposed and are embedded into the sheet, and in which it is unnecessary to apply a load that may interfere with the normal operation of a heat generating body and a heat dissipator to the heat generating body and the heat dissipator when the heat conductive sheet is disposed therebetween.

Solution to Problem

The present inventors have conducted studies on the orientation state of the fibrous fillers under the assumption that the main cause of the problems in the conventional technique is that the fibrous fillers are oriented in the direction of the thickness of the heat conductive sheet. The present inventors have found that the above object can be achieved by setting the ratio of the fibrous fillers that are not oriented in the direction of the thickness of the heat conductive sheet in all the fibrous fillers within a predetermined relatively high range. Thus, the present invention has been completed.

Accordingly, the present invention provides a heat conductive sheet including fibrous fillers and a binder resin, wherein the ratio of the fibrous fillers that are not oriented in a direction of a thickness of the heat conductive sheet in all the fibrous fillers is 45 to 95%.

Advantageous Effects of Invention

In the heat conductive sheet of the present invention, the ratio of the fibrous fillers that are not oriented in the direction of the thickness of the heat conductive sheet in all the fibrous fillers is 45 to 95%. Therefore, the frequency of contact between the fibrous fillers in the heat conductive sheet is high, and the thermal resistance thereby decreases. In addition, the exposed ends of the fibrous fillers do not remain exposed and are embedded into the sheet, so that it is unnecessary to apply a load that may interfere with the normal operation of a heat generating body and a heat dissipator to the heat generating body and the heat dissipator when the heat conductive sheet is disposed therebetween. Moreover, occurrence of cracks when the heat conductive sheet is bent can be suppressed.

DESCRIPTION OF EMBODIMENTS

The present invention is a heat conductive sheet comprising fibrous fillers and a binder resin, wherein the ratio of the fibrous fillers that are not oriented in the direction of the thickness of the heat conductive sheet in all the fibrous fillers is 45 to 95%.

The fibrous filler constituting the heat conductive sheet is used to allow heat from a heat generating body to be effectively transferred to a heat dissipator. If the average diameter of the fibrous filler is too small, the specific surface area thereof becomes excessively large, so that the viscosity of a resin composition for use in producing the heat conductive sheet may become excessively high. If the average diameter is too large, the surface irregularities of the heat conductive sheet become large, so that its adhesion to the heat generating body and the heat dissipator may deteriorate. Therefore, the average diameter is preferably 8 to 12 μm. If the aspect ratio (length/diameter) of the fibrous filler is too small, the viscosity of a heat conductive sheet-forming composition tends to become excessively high. If the aspect ratio is too large, compression of the heat conductive sheet tends to be inhibited. Therefore, the aspect ratio is preferably 2 to 50, and more preferably 3 to 30. If particular attention is given to the length of the fibers, the length of fibers is preferably 15 to 800 μm and more preferably 40 to 250 μm.

Preferred specific examples of the fibrous filler include carbon fibers, metal fibers (such as fibers of nickel and iron), glass fibers, and ceramic fibers (nonmetallic inorganic fibers such as fibers of oxides (for example, aluminum oxide, silicon dioxide, etc.), nitrides (for example, boron nitride, aluminum nitride, etc.), borides (for example, aluminum diboride etc.), and carbides (for example, silicon carbide etc.)).

The fibrous filler is selected according to the properties required for the heat conductive sheet such as mechanical properties, thermal properties, and electric properties. Particularly, pitch-based carbon fibers can be preferably used because of their high elastic modulus, favorable heat conductivity, high electric conductivity, radio shielding properties, low thermal expansion, etc.

If the contained amount of the fibrous fillers in the heat conductive sheet is too small, the heat conductivity tends to become low. If the contained amount is too high, the viscosity tends to become large. Therefore, the contained amount of the fibrous fillers in the heat conductive sheet is preferably 16 to 40 vol %, and more preferably 20 to 30 vol %. The contained amount based on 100 parts by mass of a binder resin described later and constituting the heat conductive sheet is preferably 120 to 300 parts by mass and more preferably 130 to 250 parts by mass.

In addition to the fibrous filler, a plate-like filler, a scale-like filler, a spherical filler, etc. may be used so long as the effects of the present invention are not impaired. In particular, from the viewpoint of suppressing secondary aggregation of the fibrous fillers in the heat conductive sheet-forming composition, a spherical filler having a diameter of 0.1 to 5 μm (preferably spherical alumina or spherical aluminum nitride) is used in the range of preferably 30 to 60% by volume and more preferably 35 to 50% by volume. The used amount of the spherical filler based on 100 parts by mass of the fibrous filler is preferably 100 to 900 parts by mass.

The binder resin is used to hold the fibrous fillers in the heat conductive sheet and is selected according to the properties required for the heat conductive sheet such as mechanical strength, heat resistance, electric properties, etc. Such a binder resin may be adopted by selecting from thermoplastic resins, thermoplastic elastomers, and thermosetting resins.

Examples of the thermoplastic resins include: polyethylene, polypropylene, ethylene-α olefin copolymers such as ethylene-propylene copolymers, polymethylpentene, polyvinyl chloride, polyvinylidene chloride, polyvinyl acetate, ethylene-vinyl acetate copolymers, polyvinyl alcohol, polyvinyl acetal, fluorine-based polymers such as polyvinylidene fluoride and polytetrafluoroethylene, polyethylene terephthalate, polybutylene terephthalate, polyethylene naphthalate, polystyrene, polyacrylonitrile, styrene-acrylonitrile copolymers, acrylonitrile-butadiene-styrene copolymer (ABS) resins, polyphenylene-ether copolymer (PPE) resins, denatured PPE resins, aliphatic polyamides, aromatic polyamides, polyimide, polyamide-imide, polymethacrylic acid, polymethacrylates such as polymethyl methacrylate, polyacrylic acids, polycarbonates, polyphenylene sulfide, polysulfones, polyethersulfone, polyethernitrile, polyether ketone, polyketone, liquid crystal polymers, silicone resins, and ionomers.

Examples of the thermoplastic elastomers include styrene-butadiene block copolymers and hydrogenated products thereof, styrene-isoprene block copolymers and hydrogenated products thereof, styrene-based thermoplastic elastomers, olefin-based thermoplastic elastomers, vinyl chloride-based thermoplastic elastomers, polyester-based thermoplastic elastomers, polyurethane-based thermoplastic elastomers, and polyamide-based thermoplastic elastomers.

Examples of the thermosetting resins include cross-linked rubber, epoxy resins, phenolic resins, polyimide resins, unsaturated polyester resins, and diallyl phthalate resins. Specific examples of the cross-linked rubber include natural rubber, acrylic rubber, butadiene rubber, isoprene rubber, styrene-butadiene copolymer rubber, nitrile rubber, hydrogenated nitrile rubber, chloroprene rubber, ethylene-propylene copolymer rubber, chlorinated polyethylene rubber, chlorosulfonated polyethylene rubber, butyl rubber, halogenated butyl rubber, fluorocarbon rubber, urethane rubber, and silicone rubber.

The heat conductive sheet may contain various additives as needed in addition to the fibrous fillers and the binder resin.

In the heat conductive sheet of the present invention, the ratio of the fibrous fillers that are not oriented in the thickness direction in all the fibrous fillers is 45 to 95% and preferably 60 to 90%. If the ratio is less than 45%, the heat conductivity in the direction of the thickness of the sheet may become insufficient. If the ratio exceeds 95%, the ratio of the fibrous fillers in contact with each other becomes low, so that the heat conductivity of the heat conductive sheet tends to be insufficient.

The fibrous fillers that are not oriented in the direction of the thickness of the sheet are fibrous fillers with their major axes not parallel to the thickness direction.

The ratio of the fibrous fillers that are not oriented in the thickness direction in all the fibrous fillers can be determined by observing the fibrous fillers under a microscope and counting the number of the fibrous fillers contained in a unit cube (a cube of side 0.5 mm). More specifically, "the number of observed fibrous fillers disposed in the thickness direction and having a prescribed length" when a cross section of the heat conductive sheet is observed is defined as the "number of fibrous fillers that are oriented in the thickness direction," and its ratio in all the fibrous fillers can be computed using the determined value. In this case, cross sections observed in at least two directions (length and width directions) may be used, and the average of the obtained values may be used for the computation.

The heat conductive sheet according to the present invention can be produced by a production method including the following steps (A) to (C). Each of these steps will be described in detail.

<Step (A)>

First, fibrous fillers are dispersed in a binder resin to prepare a heat conductive sheet-forming composition. The preparation may be performed by uniformly mixing the fibrous fillers and the binder resin with various additives and a volatile solvent that are added as needed using any known mixing method.

<Step (B)>

Next, a molded block is formed from the prepared heat conductive sheet-forming composition by an extrusion molding method or a die molding method.

No particular limitation is imposed on the extrusion molding method and die molding method used, and an appropriate method may be selected from various known extrusion molding methods and die molding methods according to the viscosity of the heat conductive sheet-forming composition and the properties required for the heat conductive sheet.

When the heat conductive sheet-forming composition is extruded from a die used in the extrusion molding method or when the heat conductive sheet-forming composition is injected into a mold used in the die molding method, the binder resin flows, and part of the fibrous fillers is oriented in the direction of the flow, but the majority of the fibrous fillers is oriented randomly.

When a slit is attached to the tip end of the die, the fibrous fillers are more likely to be oriented in the central portion of the extruded molded block than in its widthwise end portions. However, in the widthwise end portions of the molded block, the fibrous fillers are more likely to be oriented randomly because of the influence of the walls of the slit.

The size and shape of the molded block may be determined according to the required size of the heat conductive sheet. Examples of the molded block include a cuboid having a cross section with a vertical length of 0.5 to 15 cm and a horizontal length of 0.5 to 15 cm. The length of the cuboid may be determined as needed.

<Step (C)>

Next, the formed molded block is sliced to form a sheet. This can provide a het conductive sheet. The fibrous fillers are exposed at the surface (the sliced surface) of the sheet obtained by slicing. No particular limitation is imposed on the method of slicing, and an appropriate apparatus can be selected from known slicing apparatuses (preferably ultrasonic cutters) according to the size and mechanical strength of the molded block. When an extrusion molding method is used as the molding method, some fibrous fillers are oriented in the direction of extrusion. Therefore, the direction in which the molded block is sliced is 60 to 120° and more preferably 70 to 100° with respect to the direction of extrusion. The direction is particularly preferably 90° (orthogonal to the direction of extrusion).

No particular limitation is imposed on the slice thickness, and any appropriate slice thickness may be selected according to, for example, the intended purpose of the heat conductive sheet.

<Step (D)>

If necessary, the sliced surface of the obtained heat conductive sheet may be pressed. In this manner, the surface of the heat conductive sheet is smoothened, so that its adhesion to a heat generating body and a heat dissipator can be improved. In addition, since the heat conductive sheet is compressed, the frequency of contact between the fibrous fillers can be increased. The thermal resistance of the heat conductive sheet can thereby be reduced. To perform pressing, a pair of presses each including a flat plate and a pressing head having a flat surface may be used. The sheet may be pressed using pinch rolls.

If the pressure during pressing is too low, the thermal resistance tends to be unchanged from that of the unpressed sheet. If the pressure is too high, the sheet tends to be stretched. Therefore, the pressure is preferably 2 to 8 kgf/cm$^2$ and more preferably 3 to 7 kgf/cm$^2$.

Preferably, the pressing is performed at a temperature equal to or higher than the glass transition temperature of the binder resin, in order to increase the effect of pressing and to reduce the pressing time.

The sheet after pressing is reduced in thickness by compression. If the compression ratio of the sheet [{(thickness of sheet before pressing−thickness of sheet after pressing)/(thickness of sheet before pressing)}×100] is too small, the thermal resistance tends not to be reduced. If the compression ratio is too high, the sheet tends to be stretched. Therefore, the pressing is performed such that the compression ratio is 2 to 15%.

The surface of the sheet may be smoothened by pressing. The degree of smoothness can be evaluated by the surface glossiness (gloss value). If the surface glossiness is too small, the heat conductivity becomes low. Therefore, it is preferable to perform pressing such that the surface glossiness (gloss value) measured using a glossmeter with an incident angle of 60° and a reflection angle of 60° is 0.2 or higher.

Such a heat conductive sheet can provide a thermal device having a structure in which the heat conductive sheet is disposed between a heat generating body and a heat dissipator to dissipate the heat generated in the heat generating body to the heat dissipator. Examples of the heat generating body include IC chips and IC modules, and examples of the heat dissipator include heat sinks formed of metal materials such as stainless steel.

EXAMPLES

Example 1

A silicone A liquid (organopolysiloxane having a vinyl group), a silicone B liquid (organopolysiloxane having a hydrogensilyl group), alumina particles (average particle diameter: 3 μm), spherical aluminum nitride (average particle diameter: 1 μm), and pitch-based carbon fibers (average major axis length: 150 μm, average axial diameter: 8 μm) in respective proportions (parts by volume) shown in TABLE 1 were uniformly mixed to prepare a heat conductive sheet-forming silicone resin composition.

The heat conductive sheet-forming silicone resin composition was poured into a mold having a cuboidal internal space and thermally cured in an oven at 100° C. for 6 hours to produce a molded block. A polyethylene terephthalate release film had been applied to the inner surface of the mold with the release-treated surface of the film inward.

The obtained molded block was sliced using an ultrasonic cutter to a thickness of 0.5 mm to obtain a sheet. The shear force during slicing caused part of the fibrous fillers to be exposed at the surface of the sheet, so that fine irregularities were formed on the surface of the sheet. Then the sheet was pressed by a conventional method such that a compression ratio in TABLE 1 was achieved. The resultant heat conductive sheet was observed under an electron microscope to check that the pitch-based carbon fibers were oriented in various directions, i.e., lengthwise, widthwise, and oblique directions with respect to the direction of the thickness of the heat conductive sheet. Then the ratio of pitch-based carbon fibers not oriented in the direction of the thickness of the heat conductive sheet in all the pitch-based carbon fibers was counted. The results obtained are shown in TABLE 1.

Examples 2 to 11

Molded blocks and heat conductive sheets were produced by the same procedure as in Example 1 except that the heat conductive sheet-forming silicone resin composition was prepared according to one of compositions in TABLE 1. Then the ratio of pitch-based carbon fibers not oriented in the direction of the thickness of the heat conductive sheet in all the pitch-based carbon fibers was counted. The results obtained are shown in TABLE 1.

Comparative Examples 1 to 4

Heat conductive sheet-forming silicone resin compositions were prepared using compositions in TABLE 1, and heat conductive sheets were produced using an extrusion molding method in Japanese Patent Application Laid-Open No. 2012-23335. The central portion of each of the heat conductive sheets in which the pitch-based carbon fibers were more likely to be oriented (in the thickness direction) was cut from the heat conductive sheet. Then the cut piece was observed under an electron microscope to count the ratio of pitch-based carbon fibers not oriented in the direction of the thickness of the heat conductive sheet in all the pitch-based carbon fibers. The results obtained are shown in TABLE 1.

<Evaluation>

The thermal resistance (K/W) of each of the obtained heat conductive sheets when a load of 1 kgf/cm² was applied to the sheet and a compression ratio shown in TABLE 1 was achieved was measured using a thermal resistance measuring device according to ASTM-D5470. The results obtained are shown in TABLE 1. It is preferable that the thermal resistance be 0.2 (K/W) or less and its value per unit area be 0.65 (K·cm²/W) or less.

in all the carbon fibers was 5 to 40%, the thermal resistance was higher than 0.2 K/W (0.65 K·cm²/W).

INDUSTRIAL APPLICABILITY

In the heat conductive sheet of the present invention, the ratio of the fibrous fillers that are not oriented in the thickness direction in all the fibrous fillers is 45 to 95%. Therefore, the frequency of contact between the fibrous fillers within the heat conductive sheet is high, and the thermal resistance is thereby reduced. In addition, the exposed ends of the fibrous fillers do not remain exposed and

TABLE 1

|  | Example | | | | | | | |
| --- | --- | --- | --- | --- | --- | --- | --- | --- |
|  | 1 | 2 | 3 | 4 | 5 | 6 | 7 | 8 |
| Silicone A liquid | 19 | 19 | 19 | 19 | 19 | 15 | 15 | 19 |
| Silicone B liquid | 19 | 19 | 19 | 19 | 19 | 15 | 15 | 19 |
| Pitch-based carbon fibers | 20 | 20 | 20 | 20 | 20 | 26 | 27 | 20 |
| Spherical alumina | 42 | 42 | 42 | 42 | 25 | 18 | 20 | 42 |
| Spherical aluminum nitride |  |  |  | 17 | 26 | 23 |  |  |
| Total (parts by volume) | 100 | 100 | 100 | 100 | 100 | 100 | 100 | 100 |
| Compression ratio (%) | 19.8 | 17.6 | 15.5 | 11.9 | 14.5 | 10.5 | 10.1 | 19.8 |
| Thermal resistance (K/W) | 0.2 | 0.17 | 0.16 | 0.15 | 0.12 | 0.12 | 0.11 | 0.13 |
| Thermal resistance (K × cm²/W) | 0.628 | 0.5338 | 0.5024 | 0.471 | 0.3768 | 0.3768 | 0.3454 | 0.4082 |
| Ratio of carbon fibers not oriented in direction of sheet thickness (%) | 95 | 80 | 60 | 45 | 70 | 45 | 50 | 50 |
| Average fiber length (mm) | 150 | 150 | 150 | 150 | 150 | 150 | 150 | 100 |

|  | Example | | | Comparative Example | | | |
| --- | --- | --- | --- | --- | --- | --- | --- |
|  | 9 | 10 | 11 | 1 | 2 | 3 | 4 |
| Silicone A liquid | 19 | 19 | 14.5 | 19 | 19 | 19 | 19 |
| Silicone B liquid | 19 | 19 | 14.5 | 19 | 19 | 19 | 19 |
| Pitch-based carbon fibers | 20 | 20 | 32 | 20 | 20 | 20 | 20 |
| Spherical alumina | 42 | 42 | 18 | 42 | 42 | 42 | 42 |
| Spherical aluminum nitride |  |  | 21 |  |  |  |  |
| Total (parts by volume) | 100 | 100 | 100 | 100 | 100 | 100 | 100 |
| Compression ratio (%) | 17.6 | 15.5 | 5.6 | 3.4 | 5.7 | 7.2 | 9.8 |
| Thermal resistance (K/W) | 0.14 | 0.17 | 0.16 | 0.23 | 0.22 | 0.21 | 0.21 |
| Thermal resistance (K × cm²/W) | 0.4396 | 0.5338 | 0.5024 | 0.7222 | 0.6908 | 0.6594 | 0.6594 |
| Ratio of carbon fibers not oriented in direction of sheet thickness (%) | 50 | 50 | 45 | 5 | 15 | 30 | 40 |
| Average fiber length (mm) | 250 | 40 | 100 | 150 | 150 | 150 | 150 |

In the heat conductive sheets in Examples 1 to 11 in TABLE 1, since the ratio of carbon fibers not oriented in the direction of the thickness of the heat conductive sheet in all the carbon fibers was 45 to 95%, the thermal resistance value was preferably low (0.2 K/W or lower (0.65 K·cm²/W or lower)). As can be seen from the results in Examples 8 to 11, even when the average fiber length of the carbon fibers is 40 to 250 μm, favorable results are obtained.

However, in the heat conductive sheets in Comparative Examples 1 to 4, since the ratio of carbon fibers not oriented in the direction of the thickness of the heat conductive sheet are embedded into the sheet, and it is not necessary to apply a load that may interfere with the normal operation of a heat generating body and a heat dissipator to the heat generating body and the heat dissipator when the heat conductive sheet is disposed therebetween. Therefore, the heat conductive sheet of the present invention is useful as a heat conductive sheet disposed between a heat dissipator and a heat generating body such as an IC chip or an IC module.

The invention claimed is:
1. A heat conductive sheet comprising fibrous fillers and a binder resin, wherein:

a ratio of the fibrous fillers that are not oriented in a direction of a thickness of the heat conductive sheet in all the fibrous fillers is 45 to 95%, the ratio being based on the number of all the fibrous fillers, a surface glossiness of the heat conductive sheet measured using a glossmeter with an incident angle of 60° is 0.2 or higher, and the binder resin is a silicone resin.

2. The heat conductive sheet according to claim 1, wherein the fibrous filler has an average diameter of 8 to 12 μm and an aspect ratio of 2 to 50.

3. The heat conductive sheet according to claim 1, wherein the fibrous filler is a pitch-based carbon fiber.

4. The heat conductive sheet according to claim 1, wherein the fibrous filler is contained in an amount of 16 to 40 vol % in the heat conductive sheet.

5. The heat conductive sheet according to claim 1, further comprising a non-fibrous filler.

6. The heat conductive sheet according to claim 5, wherein the non-fibrous filler is spherical aluminum oxide or spherical aluminum nitride.

7. The heat conductive sheet according to claim 1, wherein the fibrous fillers have a length of from 15 μm to 800 μm.

* * * * *